(12) United States Patent
Searby

(10) Patent No.: US 7,894,210 B1
(45) Date of Patent: Feb. 22, 2011

(54) APPARATUS AND METHOD FOR RETAINING CIRCUIT BOARDS

(75) Inventor: Tom J Searby, Eaton, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 97 days.

(21) Appl. No.: 12/533,111

(22) Filed: Jul. 31, 2009

(51) Int. Cl.
*H05K 7/14* (2006.01)
*H05K 7/18* (2006.01)
(52) U.S. Cl. .................. 361/802; 361/752; 361/803
(58) Field of Classification Search ............. 361/752, 361/730, 790, 797, 800–803, 807, 810; 312/223.1, 312/223.2
See application file for complete search history.

(56) References Cited

U.S. PATENT DOCUMENTS

| | | | |
|---|---|---|---|
| 5,673,175 A * | 9/1997 | Carney et al. | 361/679.58 |
| 6,138,839 A * | 10/2000 | Cranston et al. | 211/41.17 |
| 6,353,541 B1 * | 3/2002 | Leman et al. | 361/809 |
| 6,396,685 B1 | 5/2002 | Chien | |
| 6,693,802 B2 | 2/2004 | Vier et al. | |
| 6,738,261 B2 | 5/2004 | Vier et al. | |
| 6,970,363 B2 * | 11/2005 | Bassett et al. | 361/801 |
| 7,012,813 B2 * | 3/2006 | Wang et al. | 361/801 |
| 7,254,040 B2 | 8/2007 | Barina et al. | |
| 7,545,650 B2 * | 6/2009 | Sanchez et al. | 361/759 |
| 7,561,440 B2 * | 7/2009 | Dai | 361/801 |
| 2007/0076399 A1 | 4/2007 | Barina et al. | |
| 2009/0016037 A1 | 1/2009 | Chen et al. | |
| 2009/0067136 A1 | 3/2009 | Cheney et al. | |

* cited by examiner

*Primary Examiner*—Hung S Bui

(57) ABSTRACT

Apparatus for retaining a plurality of circuit boards includes a chassis that defines an array of mounting surfaces. Each mounting surface is configured to receive a bracket attached to one of the plural circuit boards. A retention bar is hingingly attached to the chassis at a first axis oriented transversely to the array. A lever is configured to rotate the bar about the first axis from an open position in which the brackets may be engaged with the mounting surfaces, to a closed position in which the bar retains the brackets against the mounting surfaces. An arm is configured to hinge at a second axis and to actuate the lever as the arm is rotated about the second axis.

20 Claims, 19 Drawing Sheets

APPARATUS AND METHOD FOR RETAINING CIRCUIT BOARDS

FIELD OF THE INVENTION

This invention relates generally to techniques for retaining circuit boards in electronic systems.

BACKGROUND

Many electronic systems such as computing devices include several printed circuit boards that must be interconnected. For example, in a desktop computer, expansion cards are typically inserted into connectors that are mounted on and connected to a motherboard or system board. Once interconnected, the circuit boards must be kept in place physically so that their interconnections remain intact. The term "circuit board" as used herein is intended to include all types of circuit boards including, without limitation, printed circuit boards, expansion cards, motherboards, system boards and the like.

DETAILED DESCRIPTION OF THE PREFERRED EMBODIMENTS

Figure 1:
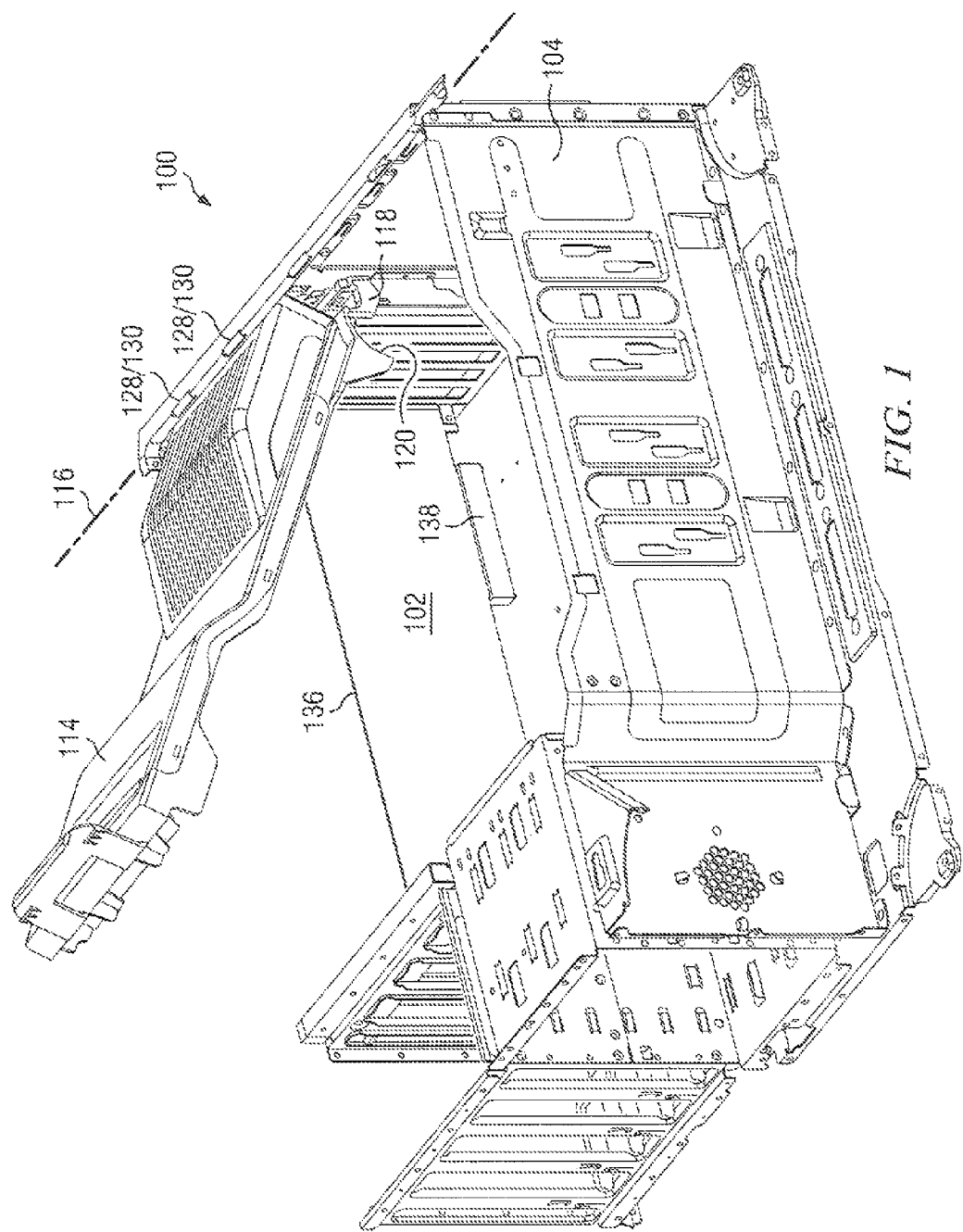
FIG. 1 is an oblique view of an apparatus for retaining a plurality of circuit boards according to a preferred embodiment of the invention, shown with an arm in an up position relative to a chassis.
Figure 2:
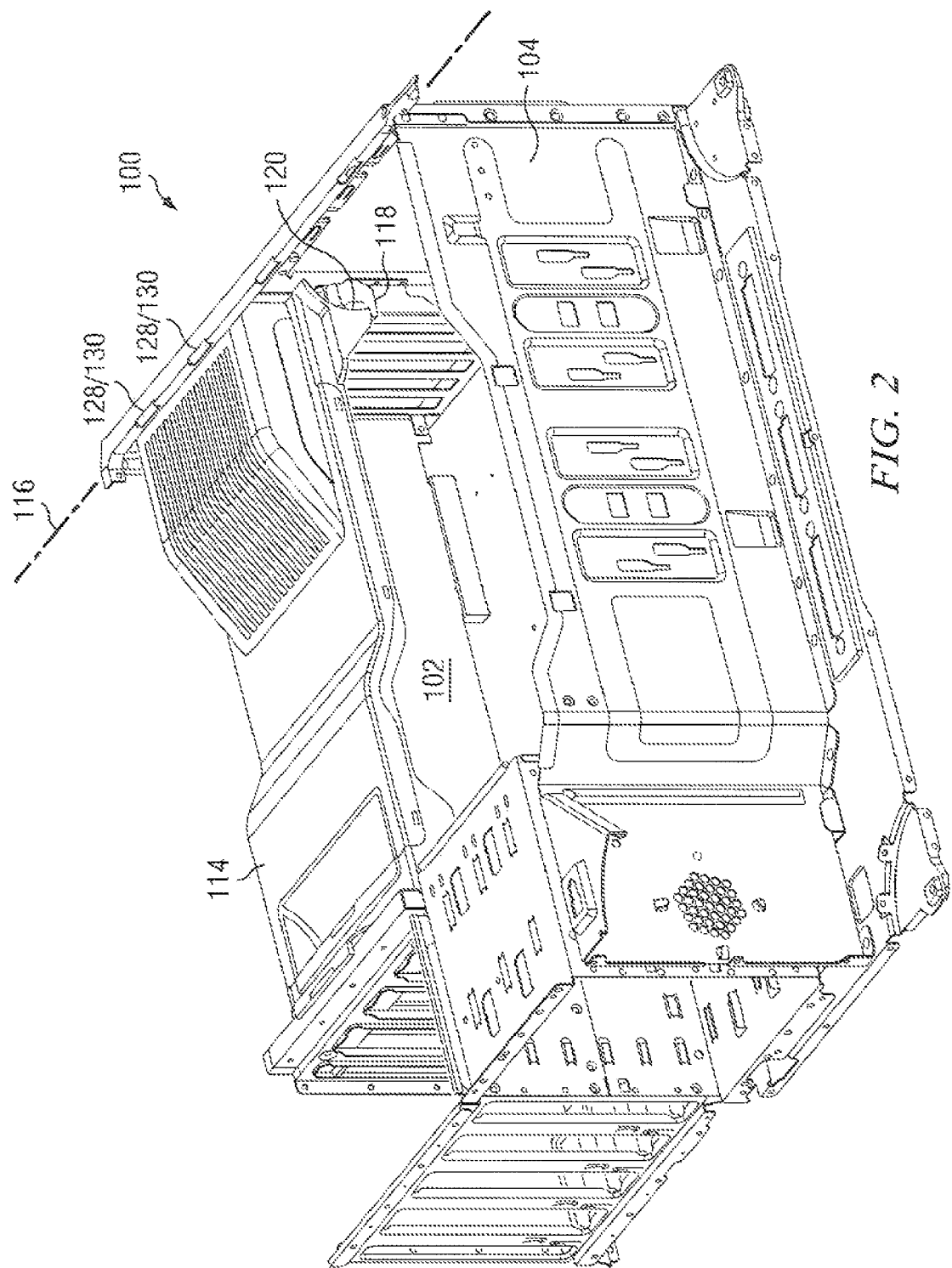
FIG. 2 is an oblique view of the apparatus of FIG. 1, shown with the arm in a down position relative to the chassis.
Figure 3:
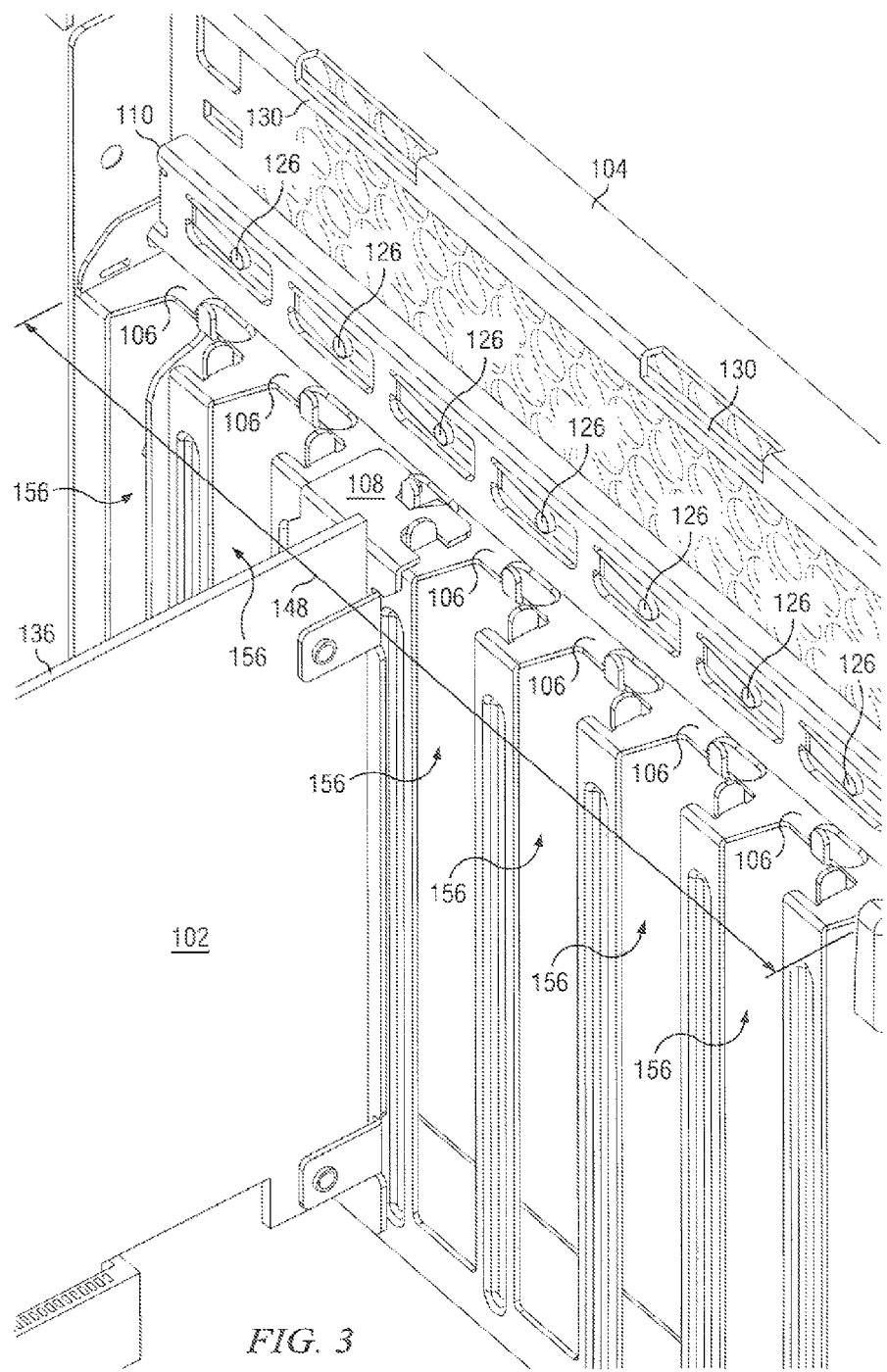
FIG. 3 is a closeup view of an array of mounting surfaces defined by the chassis of FIG. 1, shown with a bracket of one circuit board engaged therewith.

FIGS. 1-2 depict one embodiment of an apparatus 100 for retaining a plurality of circuit boards 102. A chassis 104 defines an array of mounting surfaces 106 (see FIG. 3.) Each mounting surface 106 is configured to receive a bracket 108 that is attached to one of the plural circuit boards 102. Below each mounting surface 108 is a slot 156 for receiving a vertical member of bracket 108 and for providing external access to connectors or ports from circuit boards 102. A retention bar 110 is hingingly attached to chassis 104 at an axis 112 (see FIGS. 4-5) that is oriented transversely to the array of mounting surfaces 106.

Figure 4:
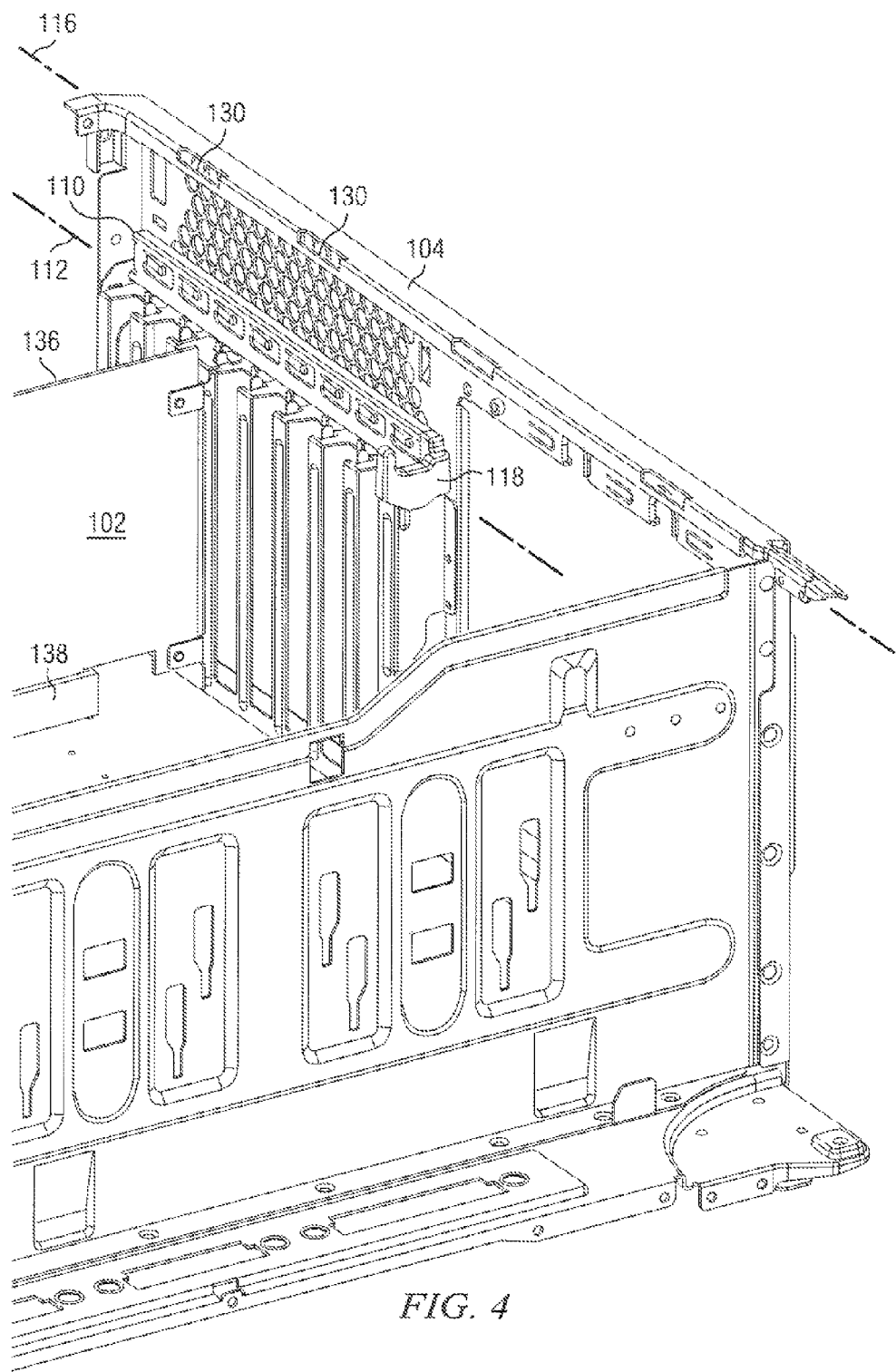
FIG. 4 illustrates a retention bar hingingly attached to the chassis of FIG. 1, shown with the retention bar in an open position.
Figure 5:
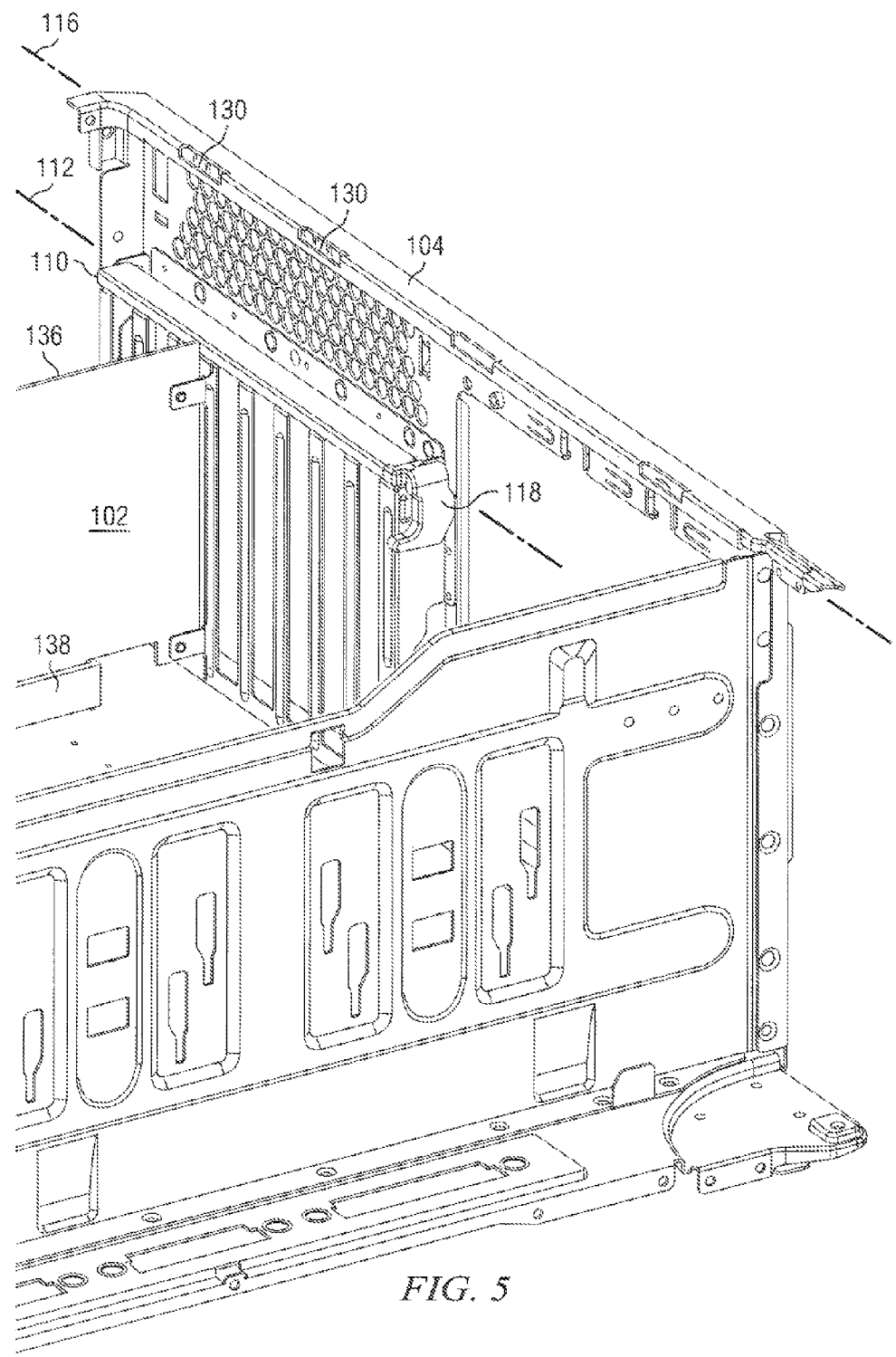
FIG. 5 illustrates the retention bar of FIG. 4 in a closed position.
Figure 6:
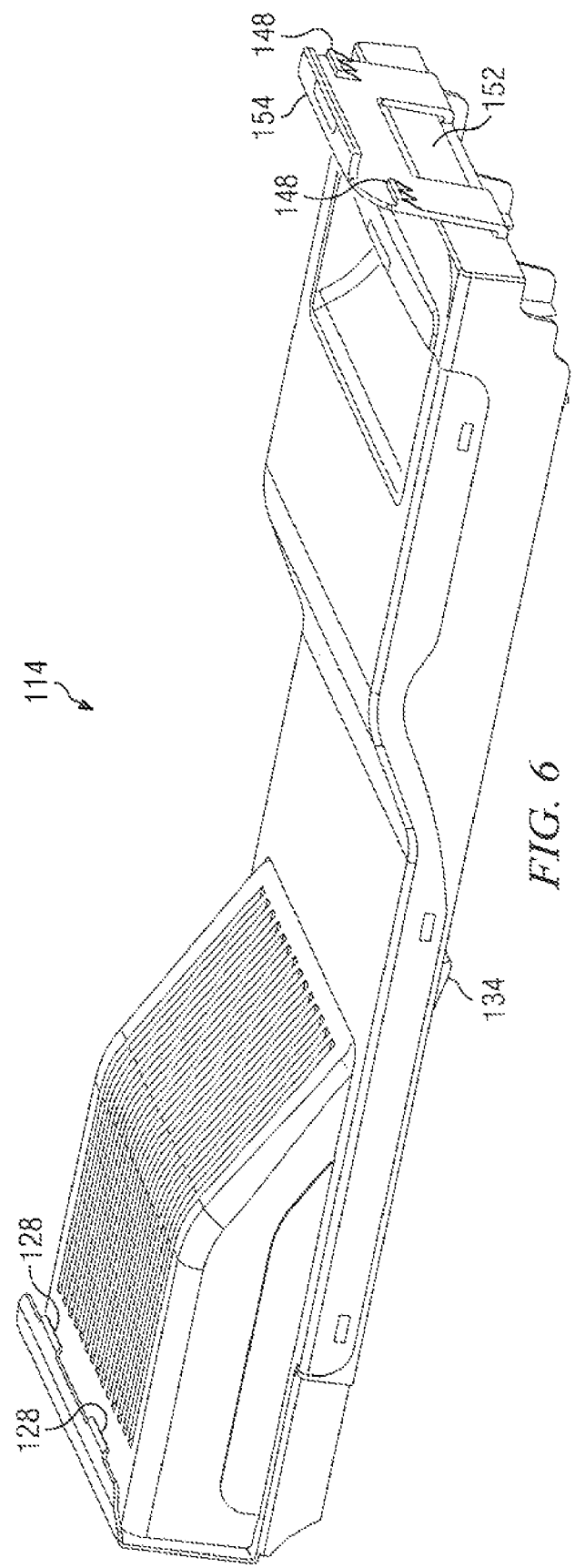
FIG. 6 is an oblique top view of the arm of FIG. 1.
Figure 7:
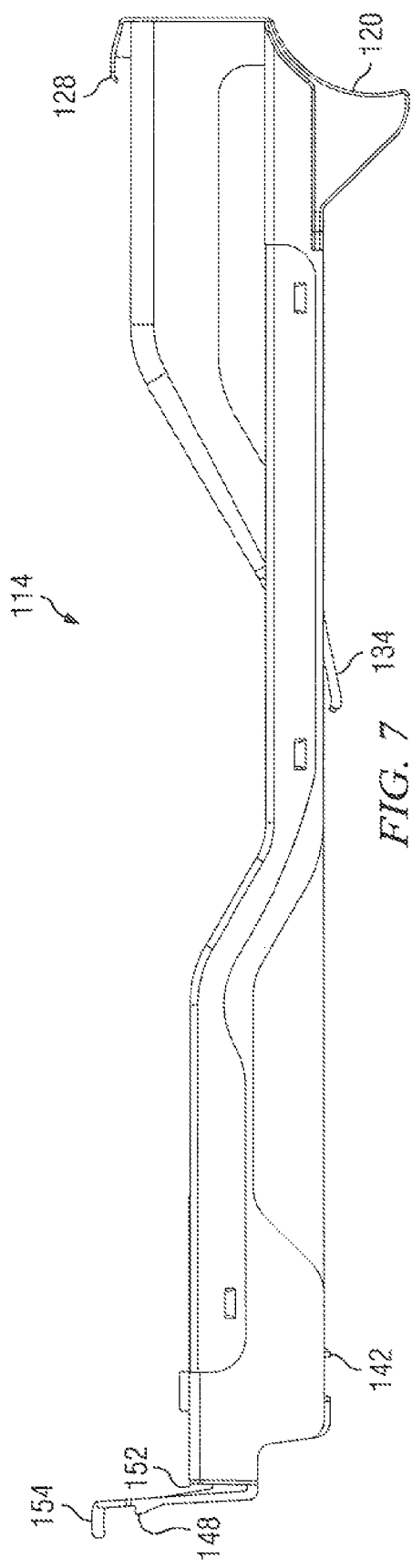
FIG. 7 is an orthogonal side view of the arm of FIG. 1.

FIG. 4 illustrates retention bar 110 in an open position in which brackets 108 may be engaged with mounting surfaces 106 as circuit boards 102 are installed in chassis 104 (or disengaged from mounting surfaces 106 as circuit boards 102 are removed from chassis 104). FIG. 5 illustrates retention bar 110 in a closed position in which retention bar 110 retains brackets 108 against mounting surfaces 106 by urging them against mounting surfaces 106. Retention bar 110 includes a lever 118 that is configured to rotate retention bar 110 about axis 112.

An arm 114 is also included in apparatus 100. Arm 114 may be detachable from chassis 104 in some embodiments or permanently attached to chassis 104 in other embodiments. When arm 114 is attached to chassis 104, it is configured to hinge at an axis 116 between up and down positions relative to chassis 104. FIG. 1 illustrates arm 114 in the up position. FIG. 2 illustrates arm 114 in the down position. As shown in FIGS. 1-2, arm 114 is configured to actuate lever 118 as arm 114 is rotated about axis 116.

Figure 9:
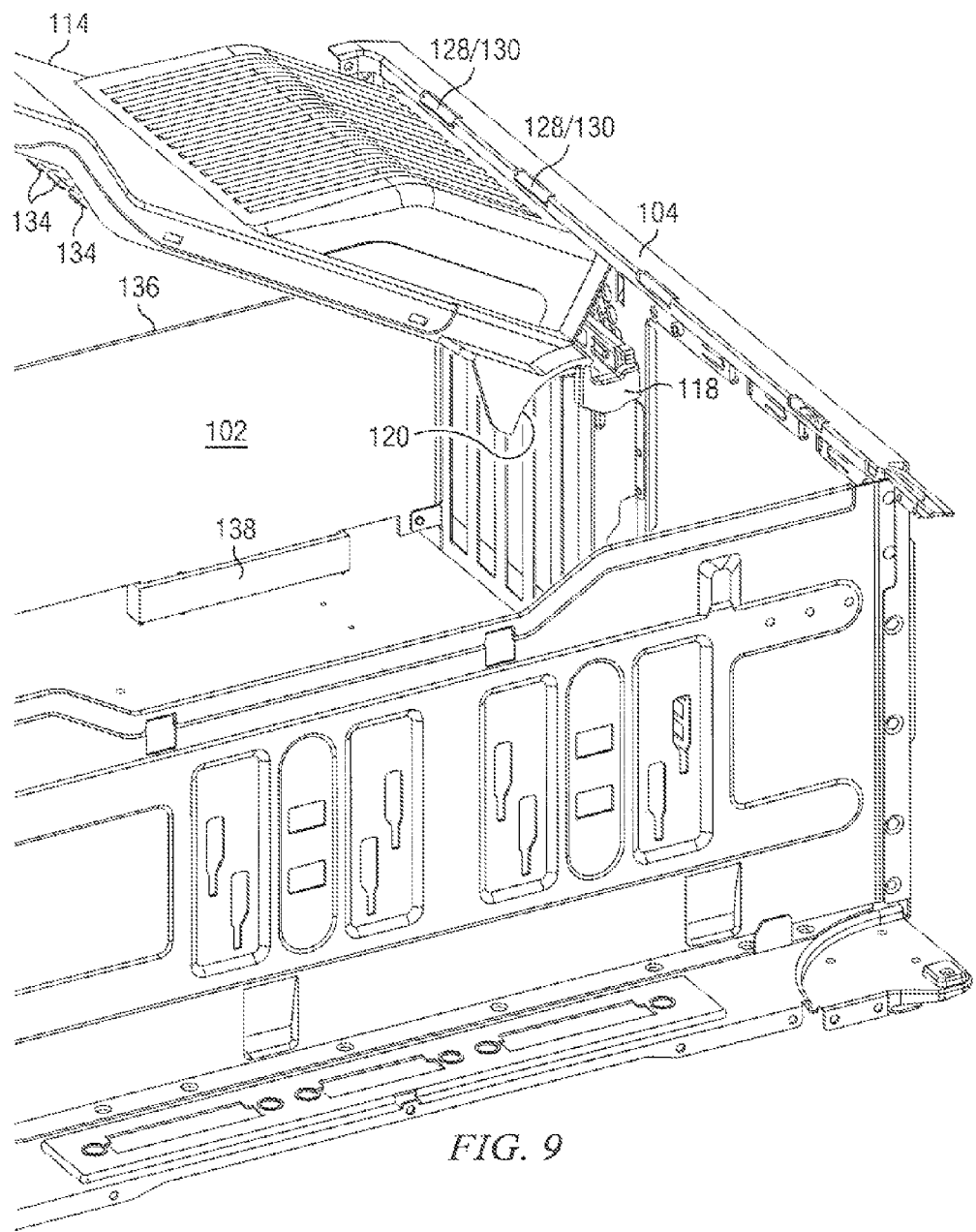
FIG. 9 is a closeup view of the arm of FIG. 1 in the up position, shown with an arcuate surface of the arm in contact with a lever of the retention bar of FIGS. 4-5.
Figure 10:
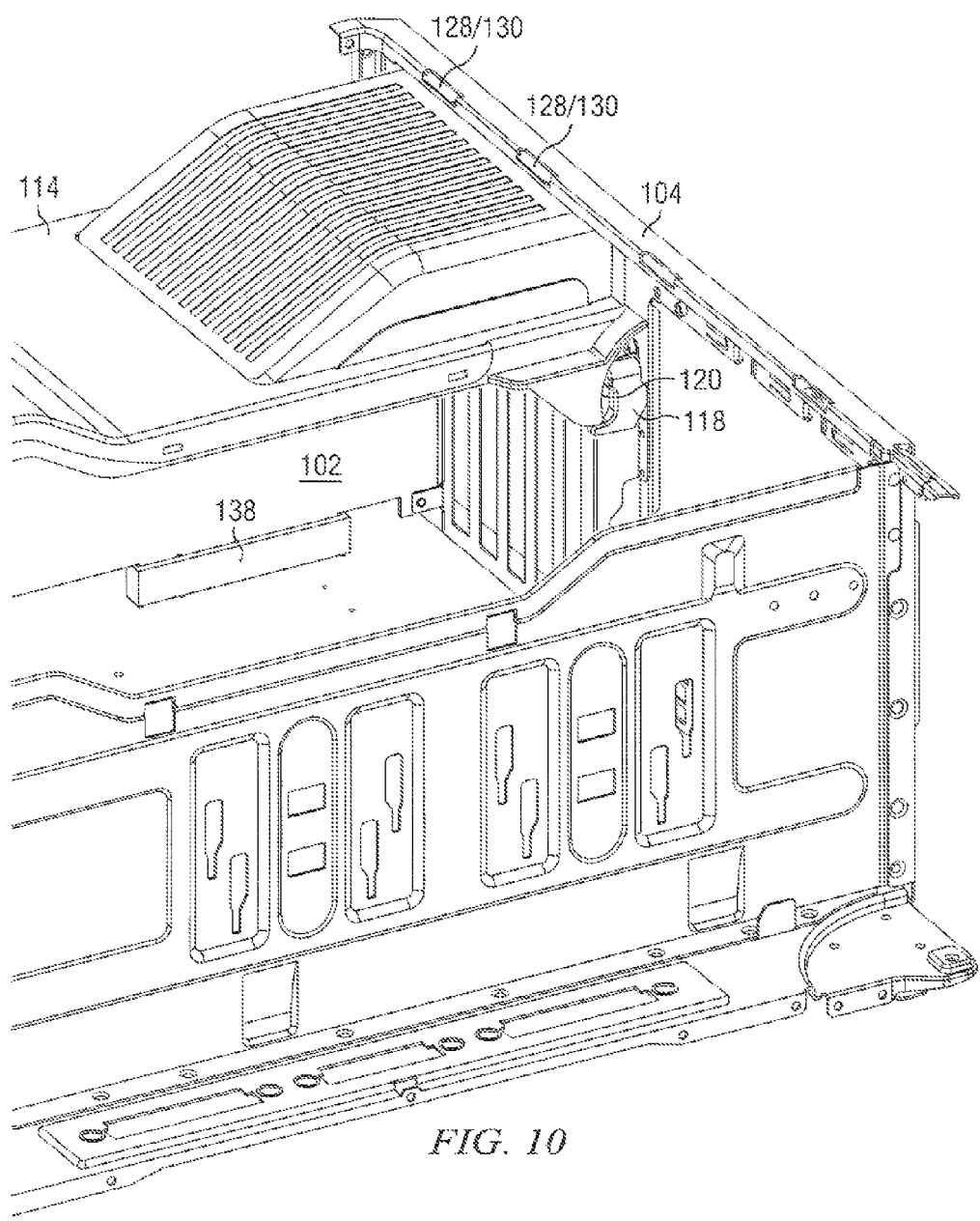
FIG. 10 is a closeup view of the arm of FIG. 1 in the down position, shown with the lever of the retention bar of FIG. 4 having slipped over one end of the arcuate surface of the arm.
Figure 11:
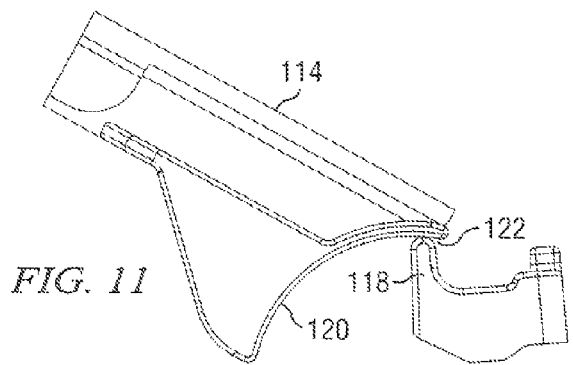
FIGS. 11-14 are orthogonal views illustrating actuation of the lever of FIGS. 9-10 at various stages by the arcuate surface of the arm.
Figure 12:
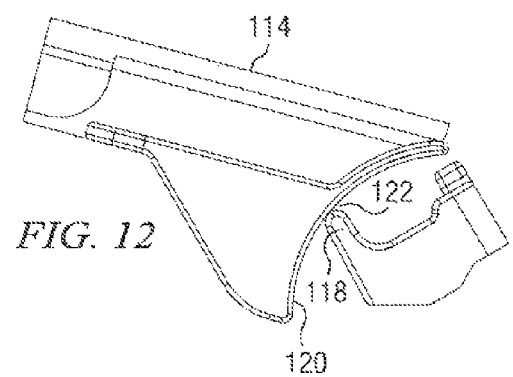
Figure 13:
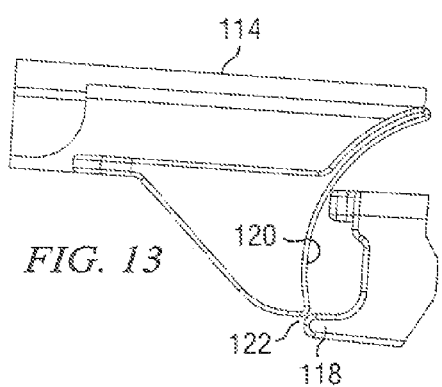
Figure 14:
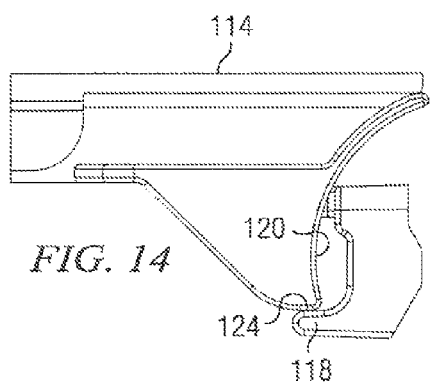

The actuation of lever 118 by arm 114 may be accomplished in a variety of ways. In the illustrated embodiment, arm 114 includes an arcuate surface 120 for engaging lever 118. As illustrated in closeup at FIGS. 9-10, and in even further closeup at FIGS. 11-14, a point of contact 122 between arm 114 and lever 118 slides along arcuate surface 120 as lever 118 is actuated. When arm 114 reaches the down position, lever 118 may be configured to slip over one end 124 of arcuate surface 120 as shown in FIG. 14, thus helping to keep retention bar 110 in the closed position.

In some embodiments, retention bar 110 may be biased toward the open position. This bias may be accomplished in a variety of ways. In one class of embodiments, a torsion spring may be placed along retention bar 110 to provide the bias. For example, the torsion spring may be placed at the end of retention bar 110 opposite lever 118, providing a torque on retention bar 110 relative to chassis 104. In other embodiments, other bias means may be employed. For embodiments that do not include a bias, retention bar 110 may be designed to rest against the wall of chassis 104 when in the open position, or may be designed such that friction at axis 112 is sufficient to keep retention bar 110 in the open position once it has been raised manually.

In embodiments where arm 114 is detachable from chassis 104, a variety of techniques can be employed to attach the arm to the chassis. In the illustrated embodiment, hooks 128 engage removable with corresponding shafts 130 to create the hinge at axis 116. Although hooks 128 are shown on arm 114 and shafts 130 are shown on chassis 104, in alternative embodiments hooks 128 may be provided on chassis 104 instead, and shafts 130 may be provided on arm 114 instead, or some combination thereof.

Figure 15:
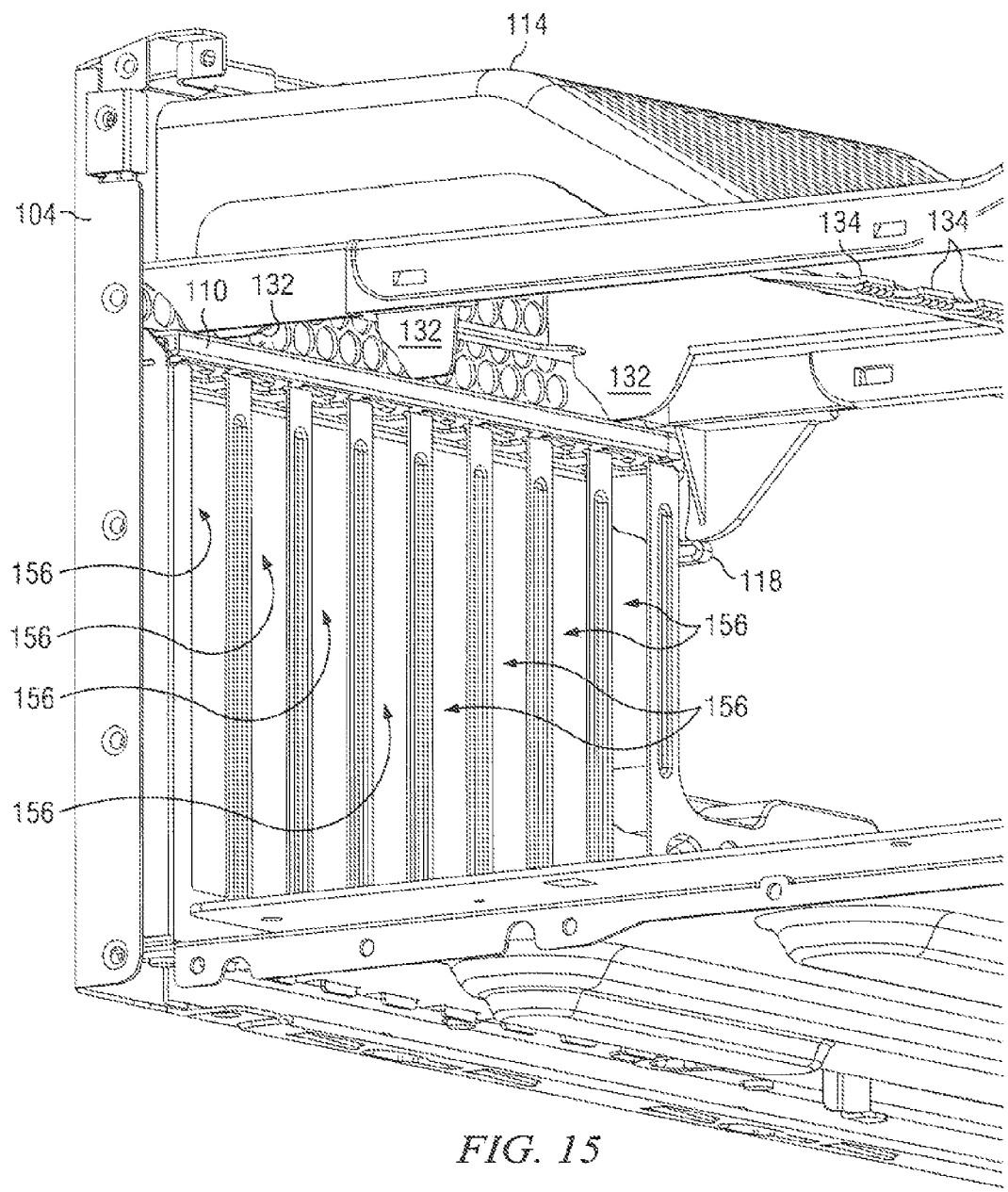
FIG. 15 is an oblique view showing ribs on the underside of the arm contacting a side of the retention bar opposite the circuit board brackets, with the arm in the closed position.

To further help in keeping retention bar 110 in the closed position when arm 114 is down, at least one rib 132 may be provided on arm 114 (see FIG. 8), configured to contact the side of retention bar 110 opposite the array of mounting surfaces 106 as shown in FIG. 15 when arm 114 is down.

Figure 8:
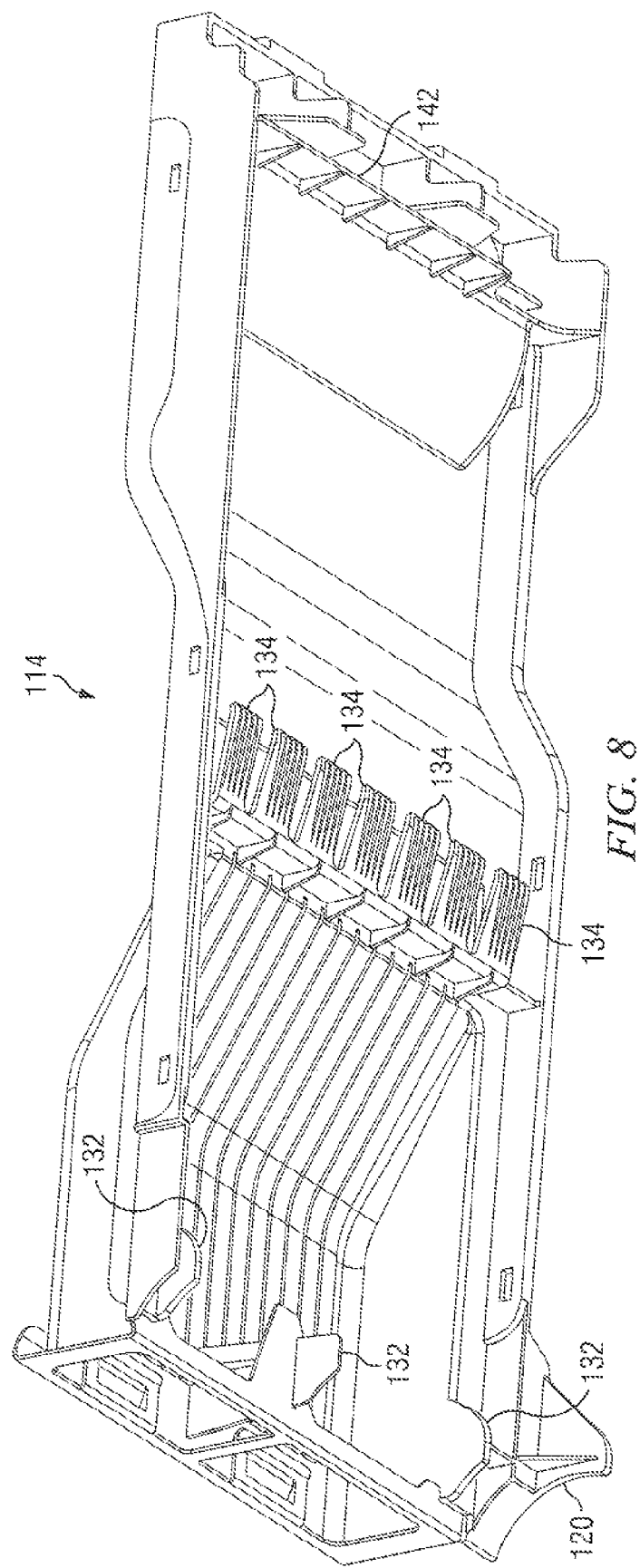
FIG. 8 is an oblique bottom view of the arm of FIG. 1.

In some embodiments, one or more flexible ribs 134 may be provided on the under side of arm 114 as shown in FIG. 8. Ribs 134 may be constructed using any suitably flexible material, such as plastic or a spring metal such as spring steel for example. Each of ribs 134 is configured to contact an edge 136 of one of the plural circuit boards 102 when arm 114 is down. The flexibility of the ribs helps to accommodate fabrication tolerances, varying heights of circuit boards 102, and also helps to urge circuit boards 102 into sockets 138 through which they interconnect with system or mother circuit board 140. Each of flexible ribs 134 may also include several longitudinal ribs protruding downward therefrom toward edge 136 of circuit board 102 as shown in FIG. 8. When arm 114 is closed, edge 136 can slip between two of these longitudinal ribs such that the longitudinal ribs help stabilize circuit board 102 in the vertical direction orthogonal to mother circuit board 140. In the embodiment shown, each of flexible ribs 134 includes five of these longitudinal ribs. Inclusion of three or more longitudinal ribs is beneficial, as this helps to accommodate circuit boards 102 that are slightly misaligned relative to the center of flexible rib 134 when arm 114 is lowered.

Figure 16:
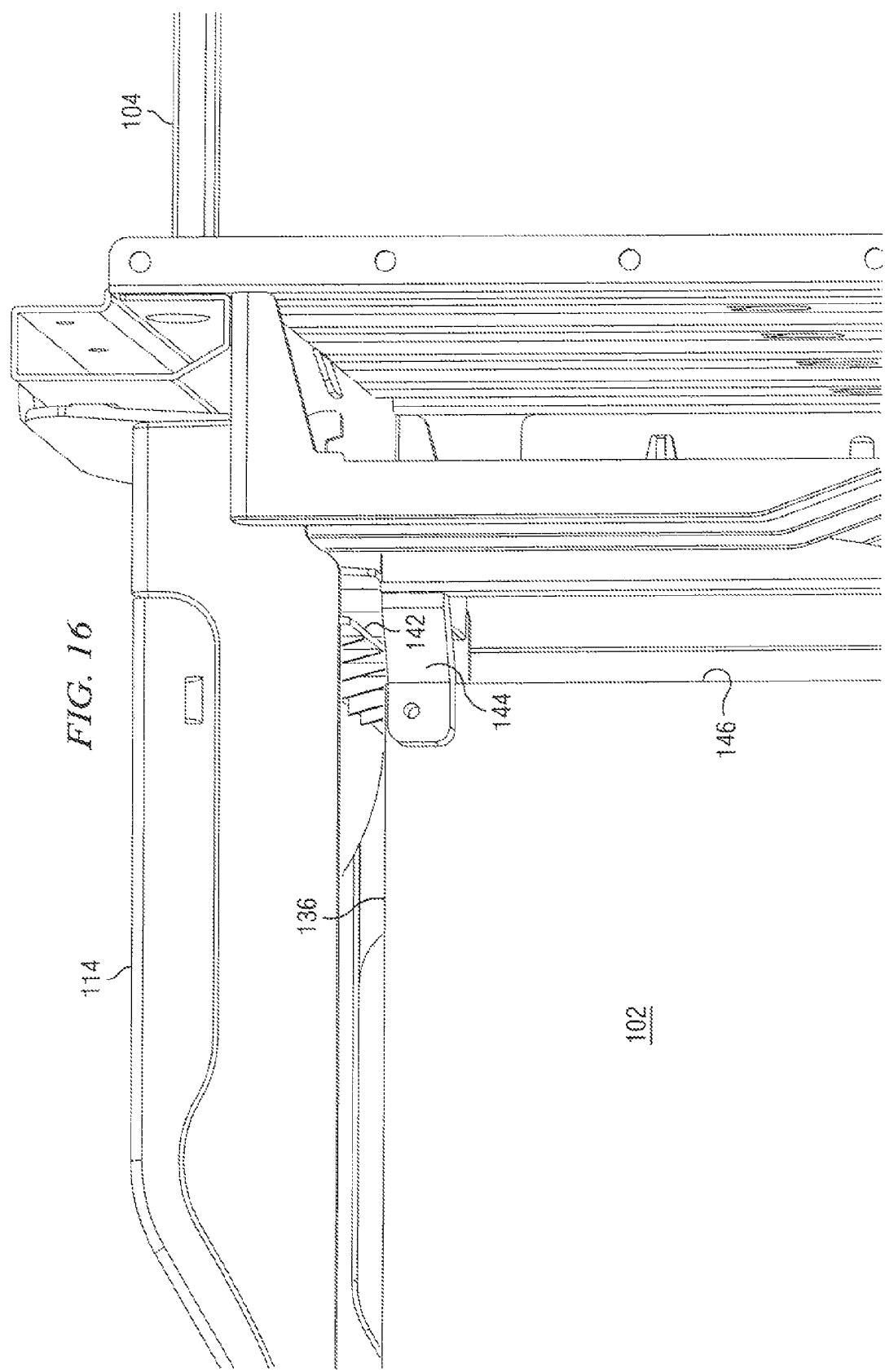
FIG. 16 is an oblique view showing a rib on the underside of the arm contacting an alignment structure attached to one of the circuit boards, with the arm in the closed position.
Figure 17:
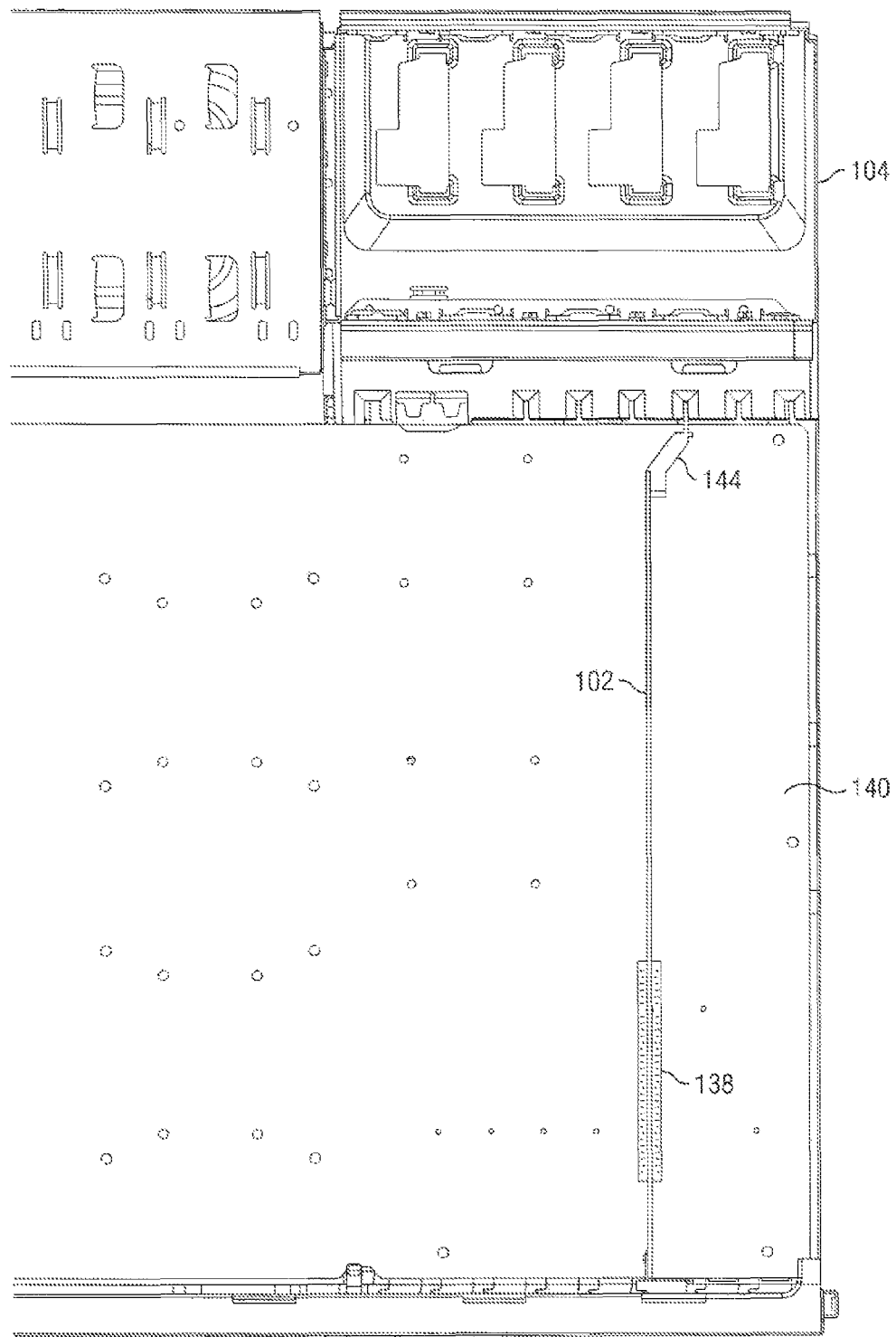
FIG. 17 is a top view of the alignment structure of FIG. 16.

It may also be beneficial in some embodiments to include one or more rigid ribs 142 on arm 114. Rigid rib 142 may be configured to contact edge 136 of circuit board 102. Alternatively, rigid rib 142 may be configured to contact alignment structures 144 that are attached to circuit boards 102 (see FIG. 16). In the embodiment shown, rigid rib 142 is sufficiently long to extend across the entire width 148 of the array of mounting surfaces 106 measured parallel to hinge axis 116. With this configuration, a single rigid rib 142 may be used to contact each of plural circuit boards 102 (or the alignment structures 144 attached thereto).

In the embodiment shown, arm 114 includes both flexible ribs 134 and rigid rib 142. With this configuration, each of circuit boards 102 is retained at three points when arm 114 is down: at bracket 108, at edge 136 near the center of the circuit board, and at the end 146 of the circuit board 102 opposite bracket 108.

In the embodiment shown, hinge axis 116 is parallel with retention bar axis 112 such that arm 114 is aligned with circuit boards 102. In alternative embodiments, arm 114 may hinge at right angles to circuit boards 102 and axis 112, or may hinge otherwise. Also in the embodiment shown, when plural circuit boards 102 are installed, the cards are oriented parallel to each other (as are slots 156) and perpendicular to hinge axis 116. Other orientations may be used.

Figure 18:
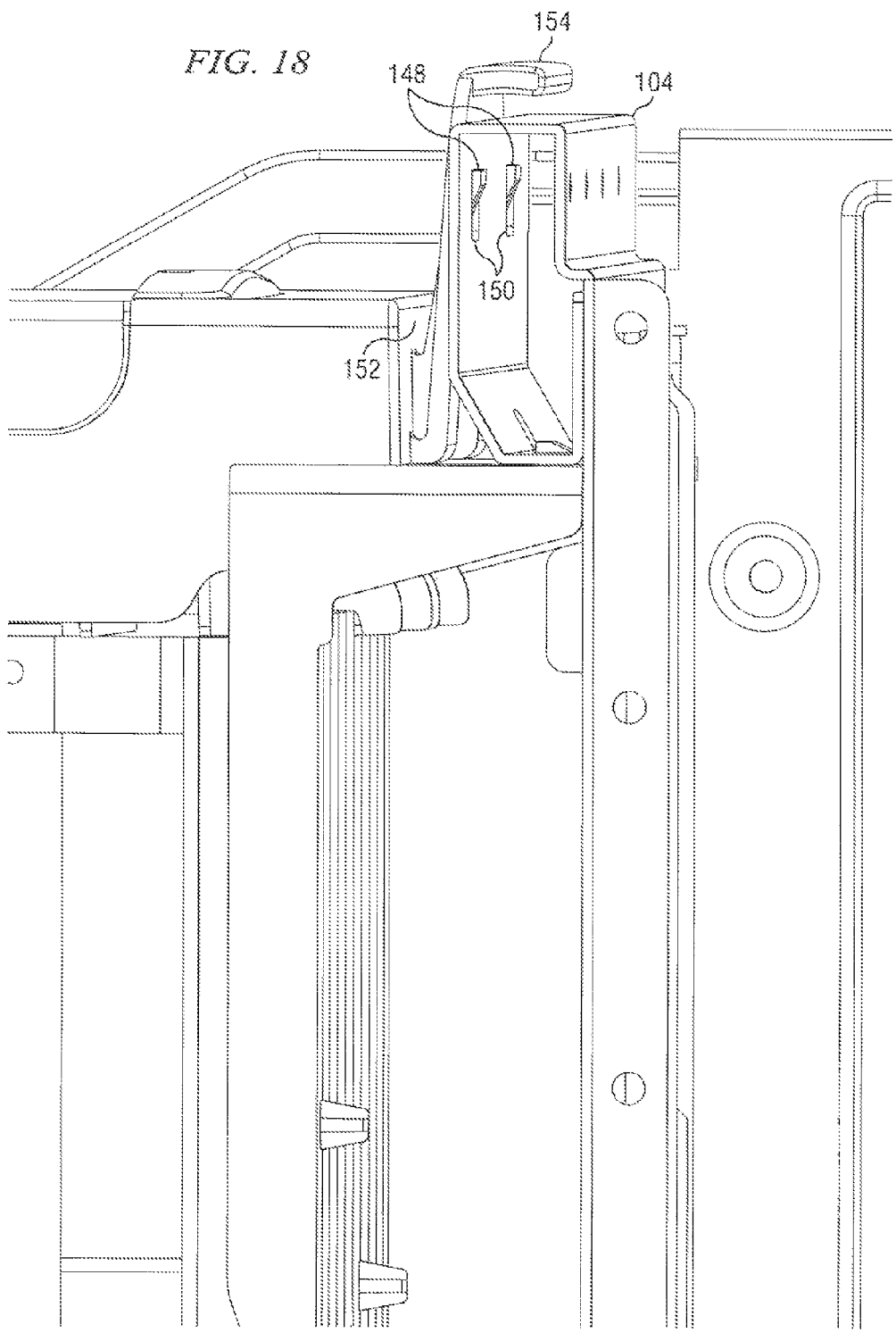
FIG. 18 is an oblique view illustrating one embodiment of a latch formed between the chassis of FIG. 1 and the arm.
Figure 19:
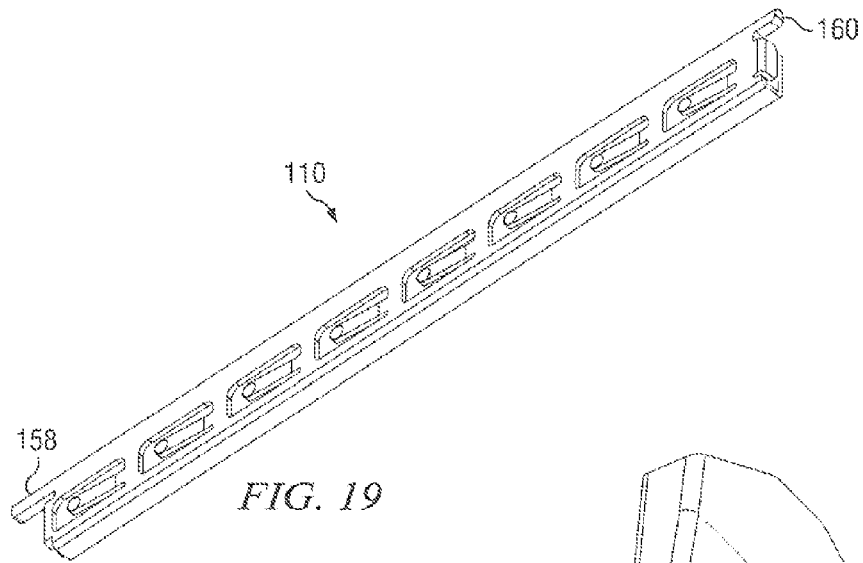
FIG. 19 is an oblique view illustrating one embodiment of the retention bar of FIGS. 4-5, shown without the lever.
Figure 20:
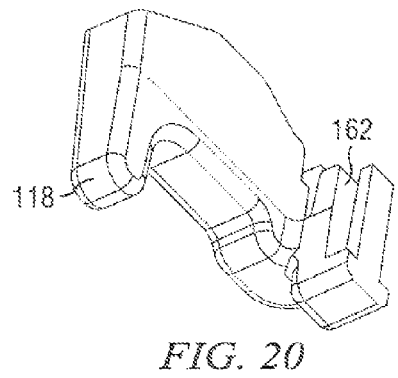
FIGS. 20-21 are front and back oblique views illustrating one embodiment of the lever of the retention bar.

It is useful to be able to latch arm 114 once it reaches the down position so that circuit boards 102 are better retained underneath arm 114. This may be accomplished in a variety of ways. For example, referring now to FIG. 18, a latch may be formed between chassis 104 and an end 152 of arm 114 radially opposite hinge axis 116. The latch may be formed using one or more flexible catches 148, aligned to engage corresponding slots 150 in chassis 104. The arrangement of the catches and the slots may, of course, be reversed such that the catches are on the chassis and the slots are on the arm. The latch is configured to hold arm 114 in the down position as shown, but may be released with the application of a manual force on touch point 154.

Figure 21:
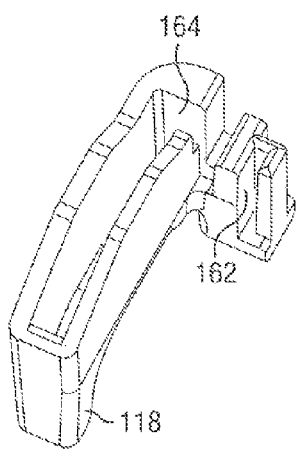
Figure 22:
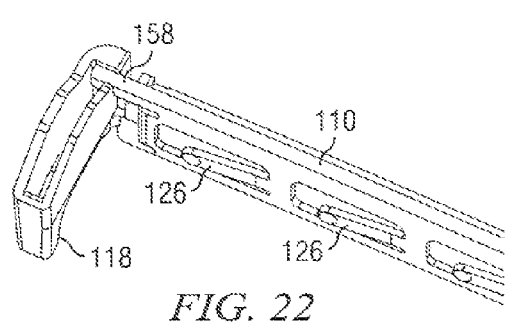
FIG. 22 is an oblique view illustrating attachment of the lever of FIGS. 20-21 to the retention bar of FIG. 19.
Figure 23:
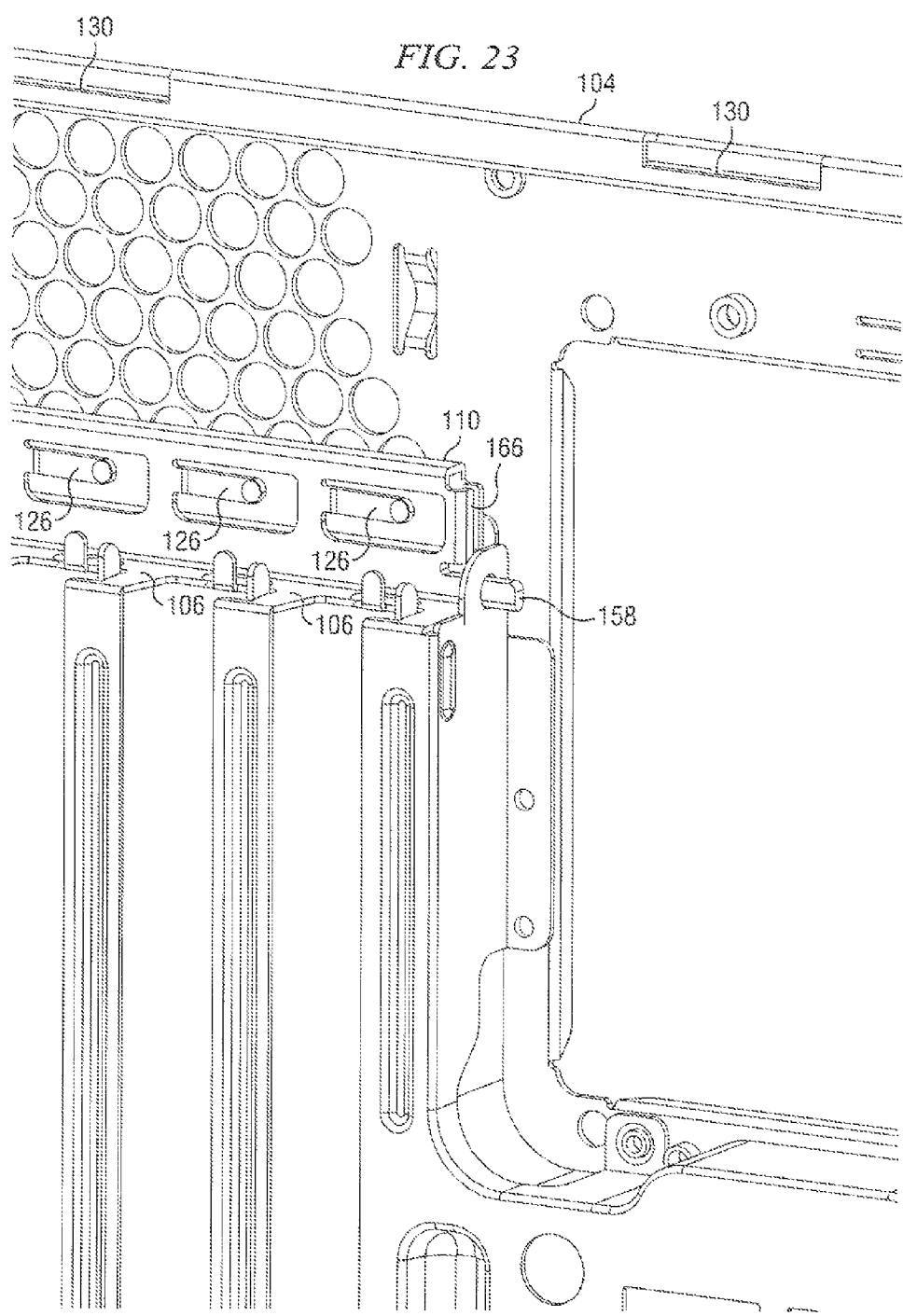
FIGS. 23-24 are oblique views illustrating one technique for attaching the retention bar of FIG. 19 to the chassis of FIG. 1.
Figure 24:
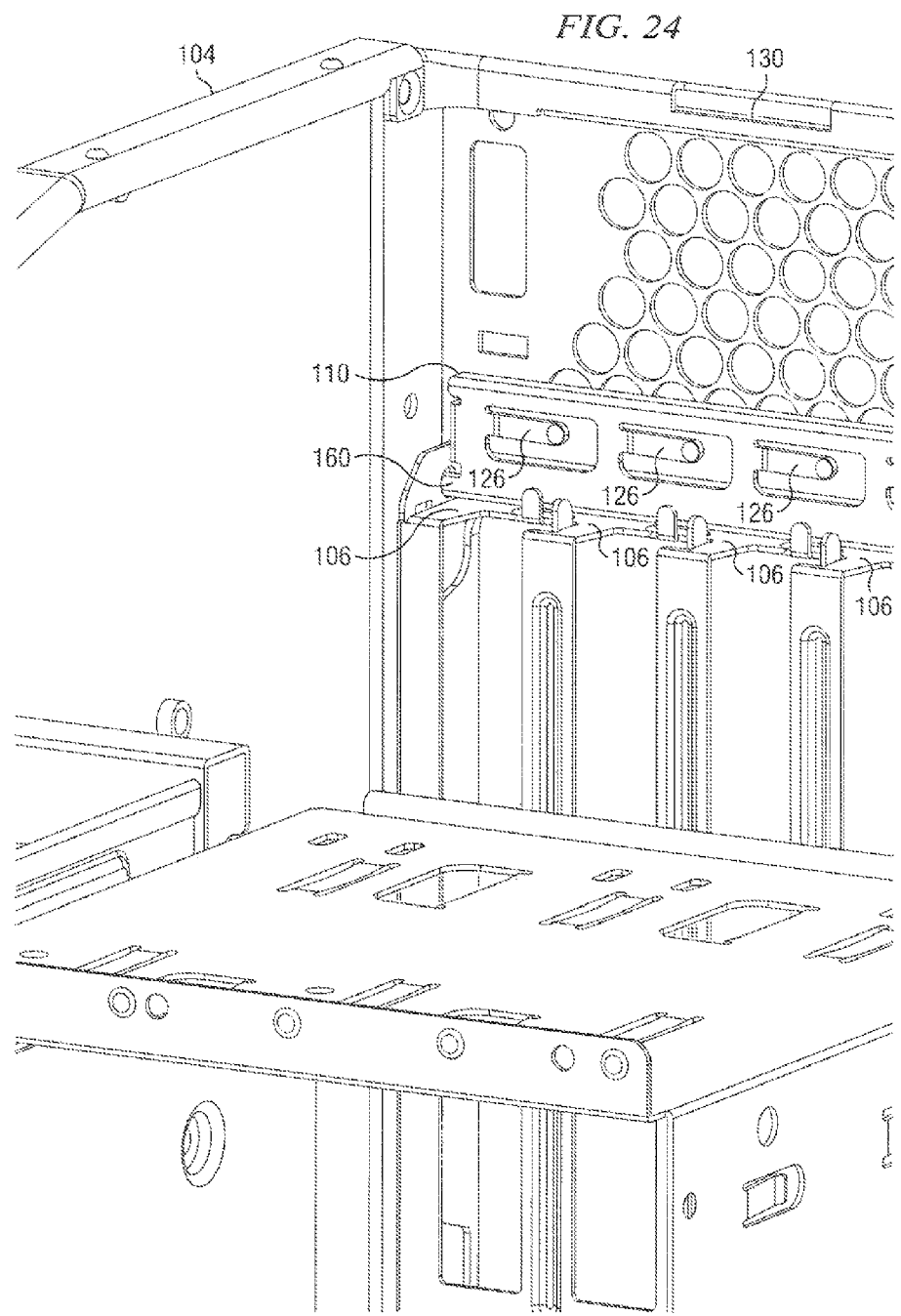

Although a variety of shapes, arrangements and techniques may be used to implement retention bar 110 and lever 118, the exemplary embodiment discussed above is shown in more detail in FIGS. 19-24. Retention bar 110 may be fabricated using any suitably rigid material, such as steel. And, if desired, resilient fingers 126 may be formed integrally therewith. A shaft 158 on one end of bar 110 may be made longer than a shaft 160 on the other end of bar 110. This facilitates installation of bar 110 into chassis 104 by inserting long shaft 158 first (see FIG. 23) and then short shaft 160 (see FIG. 24). As shown generally in FIG. 22, once bar 110 has been installed into chassis 104, lever 118 may be attached to bar 110 by inserting long shaft 158 into a corresponding recess 164 in lever 118 (see FIG. 21), and a folded tab 166 (see FIG. 23) into a corresponding recess 162 (see FIG. 21). Of course, alternative techniques may be used and different styles may be employed to implement bar 110 and lever 118. For example, lever 118 may be integrally formed with bar 110 if desired.

Figure 25:
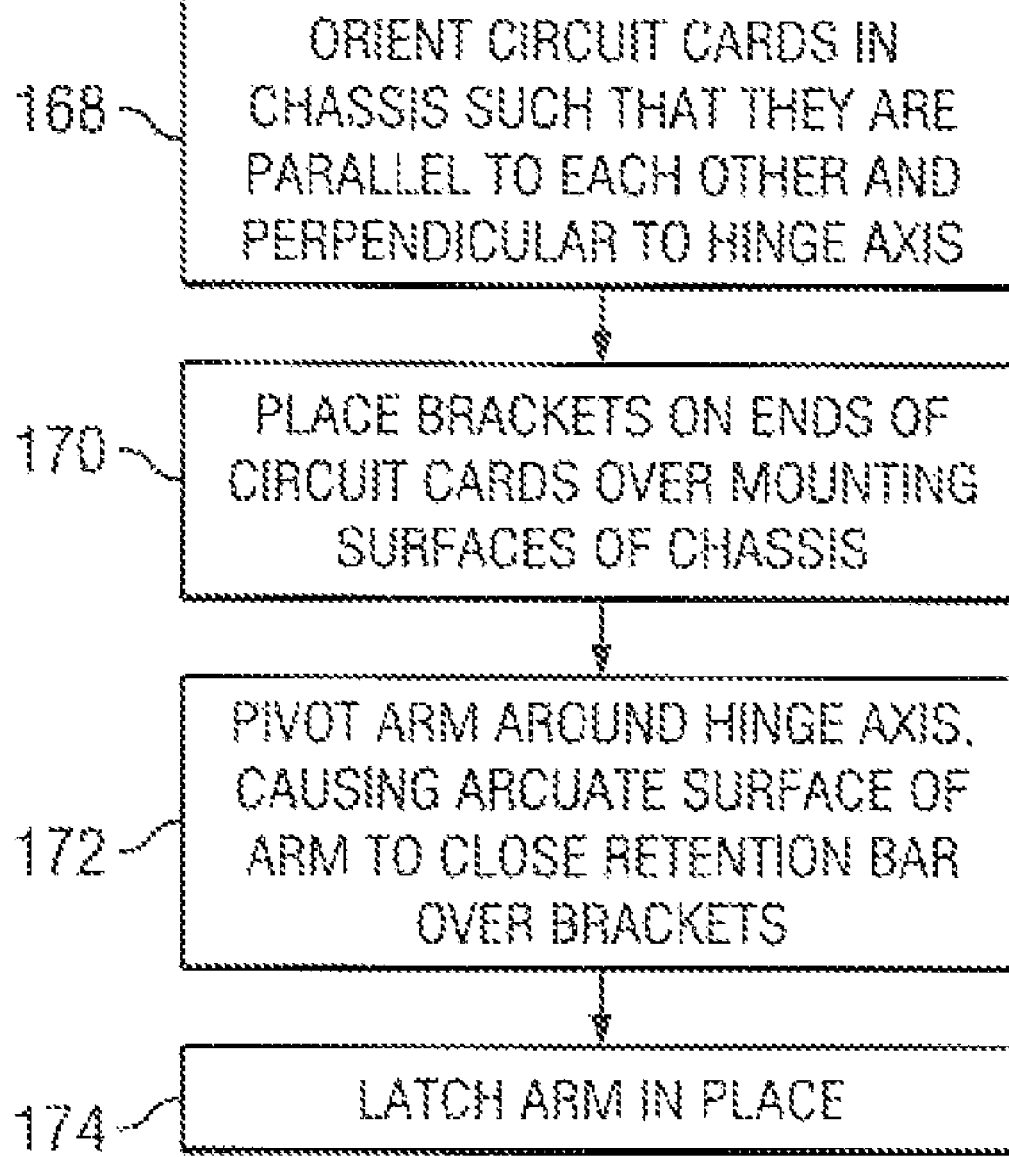
FIG. 25 is a flow diagram illustrating a method of using the apparatus of FIGS. 1-2 to retain circuit boards according to a preferred embodiment of the invention.

A preferred method for using apparatus 100 to retain plural circuit boards 102 will now be described with reference to FIG. 25. In step 168, cards 102 are installed in chassis 104 such that they are oriented parallel to each other and perpendicular to hinge axis 116. In the process, brackets 108 are placed over mounting surfaces 106 (step 170). For embodiments in which arm 114 is detachable, arm 114 is attached to chassis 104. Arm 114 is then pivoted around hinge axis 116, causing arcuate surface 120 to move retention bar 110 into its closed position (step 172). In the closed position, retention bar 110 urges brackets 108 against mounting surfaces 106 as described above. Then, in step 174, arm 114 is latched in place. As arm 114 is lowered, ribs 134, 142 may engage circuit board edges 136 and/or alignment structures 144 as described above.

While the invention has been described in detail with reference to preferred embodiments thereof, the described embodiments have been presented by way of example and not by way of limitation. It will be understood by those skilled in the art and having reference to this specification that various changes may be made in the form and details of the described embodiments without deviating from the spirit and scope of the invention as defined by the appended claims.

What is claimed is:

1. Apparatus for retaining a plurality of circuit boards, comprising:
    a chassis defining an array of mounting surfaces, each configured to receive a bracket attached to one of the plural circuit boards;
    a retention bar hingingly attached to the chassis at a first axis oriented transversely to the array and having a lever configured to rotate the bar about the first axis from an open position in which the brackets may be engaged with the mounting surfaces to a closed position in which the bar retains the brackets against the mounting surfaces; and
    an arm configured to attach to the chassis, hinged at a second axis when so attached, and configured to actuate the lever as the arm is rotated about the second axis.

2. The apparatus of claim 1, wherein:
    the arm comprises an arcuate surface for engaging the lever such that a point of contact between the arm and the lever slides along the arcuate surface as the lever is actuated.

3. The apparatus of claim 2, wherein:
    the lever is configured to slip over one end of the arcuate surface when the bar has reached the closed position.

4. The apparatus of claim 1, wherein:
    the retention bar is biased toward the open position.

5. The apparatus of claim 1, further comprising:
at least one hook disposed on either the arm or the chassis and configured to engage removably with a corresponding shaft on the chassis or the arm to create the hinge at the second axis.

6. The apparatus of claim 1, further comprising:
at least one rib on the arm configured to contact a side of the retention bar opposite the array of mounting surfaces when the bar has reached the closed position.

7. The apparatus of claim 1, wherein the arm is configured to hinge at the second axis between up and down positions, and further comprising:
at least one flexible rib on the arm configured to contact an edge of at least a first circuit board when the arm is in the down position; and
at least one rigid rib on the arm configured to contact either the edge of the first circuit board or an alignment structure attached to the first circuit board when the arm is in the down position.

8. The apparatus of claim 1, wherein:
the second axis is parallel to the first axis.

9. The apparatus of claim 1, further comprising:
a latch formed between the chassis and an end of the arm radially opposite the second axis, configured to releasably hold the arm in the down position.

10. Apparatus for retaining a plurality of circuit boards, comprising:
a chassis defining an array of slots for receiving the plural circuit boards such that the circuit boards when installed in the slots are oriented parallel to each other and perpendicular to a hinge axis;
an arm configured to hinge at the hinge axis between up and down positions and to be latched when in the down position;
at least one alignment structure configured to be fixedly attached to at least a first one of the plural circuit boards; and
at least a first rib on the arm configured to contact the at least one alignment structure when the arm is in the down position.

11. The apparatus of claim 10, wherein:
the first rib is sufficiently long to extend across the entire width of the array measured parallel to the hinge axis.

12. The apparatus of claim 10, wherein:
the first rib is rigid.

13. The apparatus of claim 10, wherein:
the first one of the plural circuit boards comprises a bracket at a first end for engaging the chassis; and
the at least one alignment structure is disposed at a second end of the circuit board opposite the first end.

14. The apparatus of claim 13, further comprising:
at least a second rib on the arm configured to contact, when the arm is in the down position, a retention bar disposed above the bracket.

15. The apparatus of claim 10, further comprising:
a plurality of flexible ribs, each configured to contact an edge of one of the plural cards when the arm is in the down position.

16. The apparatus of claim 10, wherein:
the arm is configured to removably attach to the chassis at the hinge axis.

17. The apparatus of claim 16, wherein:
the removable attachment of the arm to the chassis is accomplished with either a hook or a shaft on the arm that is configured to engage with a corresponding shaft or hook on the chassis at the hinge axis.

18. A method for retaining a plurality of circuit boards, comprising:
orienting the plural circuit boards in a chassis such that they are parallel to each other and perpendicular to a hinge axis;
placing brackets attached to the plural circuit boards over mounting surfaces of the chassis;
pivoting an arm around the hinge axis to cause an arcuate surface of the arm to move a retention bar into a closed position over the brackets such that the retention bar urges the brackets against the mounting surfaces; and
latching the arm in place.

19. The method of claim 18, further comprising:
contacting a rib of the arm to an edge of at least one of the plural cards.

20. The method of claim 18, wherein the arm is removable from the chassis and wherein the method further comprises:
attaching either a hook or a shaft of the arm to a corresponding shaft or hook on the chassis at the hinge axis.

* * * * *